United States Patent

Swanson

[11] Patent Number: 5,874,731
[45] Date of Patent: Feb. 23, 1999

[54] AMBIENT LIGHT FILTER

[75] Inventor: Scott C. Swanson, Roswell, Ga.

[73] Assignee: Schlumberger Industries, Inc., Norcross, Ga.

[21] Appl. No.: 972,494

[22] Filed: Nov. 18, 1997

Related U.S. Application Data

[63] Continuation of Ser. No. 745,834, Nov. 20, 1996, abandoned, which is a continuation of Ser. No. 407,154, Mar. 20, 1995, abandoned.

[51] Int. Cl.⁶ .............................. H01J 40/14; G01R 1/00
[52] U.S. Cl. .................................. 250/214 B; 250/222.1; 250/231.13; 340/870.02
[58] Field of Search .......................... 250/214 B, 214 R, 250/222.1, 221, 231.17, 231.14, 231.13, 231.1, 214 AL; 340/870.02, 870.03

[56] References Cited

U.S. PATENT DOCUMENTS

| | | | |
|---|---|---|---|
| 4,061,925 | 12/1977 | Van der Gaag et al. | 250/214 B |
| 4,327,362 | 4/1982 | Hoss | 340/870.02 |
| 4,614,945 | 9/1986 | Brunius et al. | 340/870.03 |
| 4,629,877 | 12/1986 | Sato et al. | 250/214 B |
| 4,665,359 | 5/1987 | Goodwin | 324/110 |
| 4,680,704 | 7/1987 | Konicek et al. | 364/525 |
| 4,728,950 | 3/1988 | Henderickson et al. | 340/870.31 |
| 4,733,169 | 3/1988 | Grindahl | 324/76.47 |
| 4,786,903 | 11/1988 | Grindahl et al. | 340/825.54 |
| 4,799,059 | 1/1989 | Grindahl et al. | 340/870.03 |
| 4,827,123 | 5/1989 | Gray | 250/231.14 |
| 4,876,700 | 10/1989 | Grindahl | 375/333 |
| 4,956,551 | 9/1990 | Repschläer et al. | 250/231.14 |
| 5,036,187 | 7/1991 | Yoshida et al. | 250/214 B |
| 5,095,203 | 3/1992 | Sato et al. | 250/222.1 |
| 5,113,130 | 5/1992 | Balch | 324/74 |
| 5,142,134 | 8/1992 | Kankel | 250/214 B |
| 5,170,051 | 12/1992 | Pistouley | 250/231.13 |
| 5,214,587 | 5/1993 | Green | 364/464.04 |
| 5,241,306 | 8/1993 | Swanson | 250/231.13 |
| 5,261,275 | 11/1993 | Davis | 73/258 |

Primary Examiner—Edward P. Westin
Assistant Examiner—John R. Lee
Attorney, Agent, or Firm—Townsend and Townsend and Crew LLP

[57] ABSTRACT

An ambient light filter includes light emitting circuitry and optical detection circuitry. The detection circuitry is positioned to detect light from the emitting circuitry. A microprocessor is provided to separately control the light emitting circuitry and the optical detection circuitry. The microprocessor determines whether light from the emitting circuitry has been detected by removing a measured component equivalent to the ambient light present at the optical detection circuitry.

18 Claims, 3 Drawing Sheets

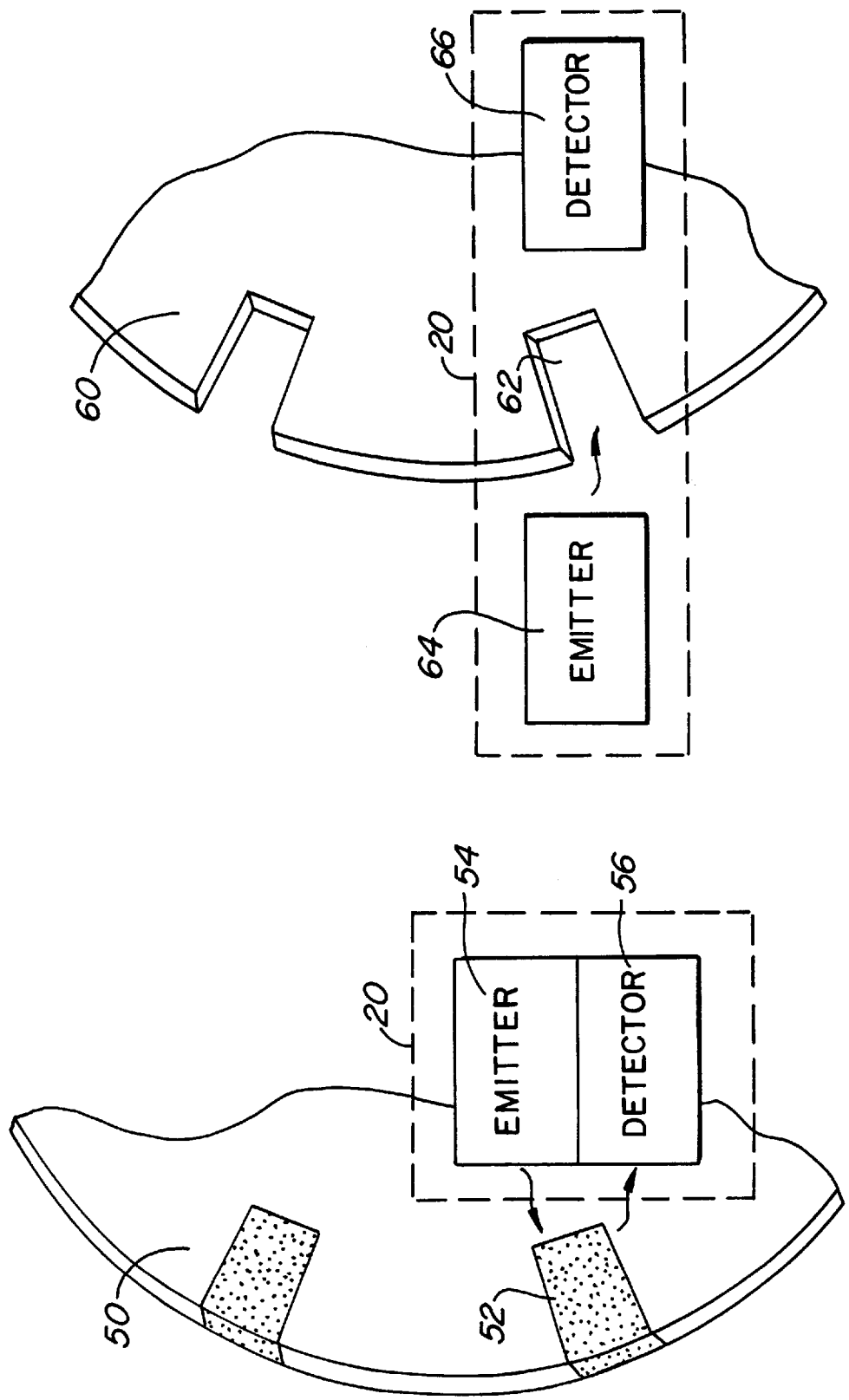

AMBIENT LIGHT FILTER

This is a continuation of application Ser. No. 08/745,834, filed Nov. 20, 1996, now abandoned, which is a continuation of application Ser. No. 08/407,154, filed Mar. 20, 1995, now abandoned.

BACKGROUND OF THE INVENTION

The present invention relates to an ambient light filter of the type which permits the reliable operation of a light detector circuit whose operation may otherwise be adversely affected by ambient light.

In particular, the invention relates to an ambient light filter which can filter out ambient light which might affect the reading of meters such as those used in the electric utility industry. Particularly, the invention relates to a method and apparatus for filtering ambient light from optical sensor systems used to detect the rotation of a shaft or disk of a meter. This filtering prevents any tampering or erroneous recognition of rotation information. Those skilled in the art will recognize that the term "tampering", as used herein is intended to include any undesired light input in any of the applications in which the present invention may be used (whether or not such undesired light input was intended to deteriorate the operation of the light sensitive circuitry).

While the filtering out of ambient light is important in any application in which such light can affect a reading or signal received by a light sensitive circuit, in the electric utility industry wherein such light sensitive circuits are used to detect and record the movement of a disk within a utility meter, i.e., an electricity meter, such ambient light can be used as a means of "tampering" with the reading ability of the light sensitive circuit. Notwithstanding the specific application for the present invention which will be explained herein, the problem presented (and the current solution) have application in any industry wherein light sensitive circuitry may be used in the presence of ambient light. Such industries include, but are not limited to, the utility metering industry, the communications industry, and numerous applications in which light sensitive circuits are used in the presence of ambient light for counting or security applications.

With respect to the preferred embodiment of the invention, as explained in greater detail herein, electric utilities use attachments to electro-mechanical meters to perform monitoring functions such as demand and time-of-use metering or remote meter reading. The electro-mechanical meters often include a rotating disk or shaft which rotates at a rate proportional to power usage. Sensors or other measuring devices are used to monitor the rotation of the disk or shaft. A standard approach to sensing the rotation of the disk involves the use of light emitting diodes and photosensors. Essentially, the diodes emit light which is sensed by the optical sensors when the disk is in a certain position. This provides an efficient means to track rotation of the disk. Rotation information is stored in electronic registers for use by the utility, which may retrieve the data through various means, including optical port coupling, radio frequency ("RF") reading, telephone modems, and electromagnetic coupling.

Several techniques are used to implement optical sensing. One common arrangement, referred to as "through-hole sensing", involves the placement of one or more apertures along an outer periphery of a rotating disk. The disk separates one or more light emitting diodes from one or more photosensors. As the disk rotates and the apertures pass through the path of the optical sensing area, a photosensor is illuminated. This causes a voltage threshold in the sensing circuit to be exceeded. The voltage threshold is set to correspond to the light exposure condition. As the non-apertured portions of the disk pass between the diode(s) and the sensor(s), light transmission is blocked to prevent the voltage threshold from being exceeded. An electronic register in the meter sensing system is used to store information regarding the rotation of the disk.

In another common arrangement, referred to as "reflective sensing", a disk is provided with one or more darkened light absorbing areas instead of one or more apertures. Light is emitted onto the rotor disk. The light is reflected to a detector if the light hits a reflective portion of the disk. Otherwise, the light is absorbed by a darkened area. Power usage is determined by tracking the number of transitions sensed by the detector circuit. A meter reading scheme using such a variation is disclosed in U.S. Pat. No. 4,327,362, issued to Hoss on Apr. 27, 1982.

Other sensing approaches are also used. Shutters or notches may be placed around the periphery of disks or on a meter disk spindle. Emitters and photosensors are then used to detect movement of these shutters. Examples of such systems are shown in U.S. Pat. No. 4,827,123, issued to Gray on May 2, 1989 and in U.S. Pat. No. 5,241,306, issued to Swanson on Aug. 31, 1993.

Although each of these sensing approaches have slightly different characteristics and features, they share a common need to provide reliable and consistent sensing. The rotation information stored and used by the utility will be in error if the sensing of a meter's rotation fails even temporarily. Current systems suffer in that high levels of ambient light can cause temporary failure of a sensor. This temporary failure can result from fluctuations in naturally-occurring light sources or from customer tampering. Dishonest customers have been known to evade meter sensing devices by directing a light source at the meter sensor.

One approach for handling such abuse involves alerting the utility of interference with a sensor. In this way, a utility may monitor and identify individual users to determine specific instances of abuse. Such an approach is disclosed in the commonly-assigned application entitled METER SENSOR LIGHT TAMPER DETECTOR filed herewith on Mar. 20, 1995, and assigned Ser. No. 08/407,143, now abandoned, which is incorporated herein by reference. However, there are circumstances where it is desirable to do more than just detect the fact of tampering. Instead, it is often desirable to prevent any tampering or interference with a meter sensor.

One common attempt to prevent meter failures from ambient light is to modulate the optical emitter at a known frequency and to design the optical detector to respond to the known frequency by installing an electronic filter in the optical detector's output path. Unfortunately, this approach increases the cost and complexity of the sensor design. Further, it does not prevent a knowledgeable customer from circumventing the filter by modulating a light source at the sensor's modulation frequency.

As automatic meter reading systems, i.e., RF systems become more prevalent, automatic means to recognize that a meter has been tampered with also become more important. This is because a utility will no longer be able to rely upon the meter reader (who formerly read the meter and could observe any obvious tampering) to observe that a meter has been tampered with. Such RF systems are sold by the assignee of the present invention as well as by other companies, and they are described in numerous U.S. patents, including U.S. Pat. No. 4,614,945 of Brunius, et al.; U.S. Pat. No. 4,733,169 of Grindahl; U.S. Pat. No. 4,786,903 of Grindahl, et al.; U.S. Pat. No. 4,799,059 of Grindahl, et al.; and U.S. Pat. No. 4,876,700 of Grindahl.

In view of the above, it would be desirable to provide a method and apparatus for preventing ambient light from interfering with a meter disk sensor without increasing the cost or complexity of a sensor.

SUMMARY OF THE INVENTION

According to the invention, a method and apparatus for filtering ambient light from a meter sensor includes light emitting circuitry and optical detection circuitry. The detection circuitry is positioned to detect light from the emitting circuitry. A microprocessor is provided to separately control the light emitting circuitry and the optical detection circuitry. The logic associated with the firmware controlling the microprocessor determines whether light from the emitting circuitry has been detected by removing a measured component equivalent to the ambient light present at the optical detection circuitry. The result is a simple and inexpensive approach to filtering ambient light from a system. This prevents tampering with the operation of meter sensors and avoids erroneous utility usage information due to ambient light interference with sensor performance.

In one specific embodiment, the present invention is implemented using circuitry commonly used in meter sensor devices. A single low-cost capacitor is added to existing components to achieve the ambient light filtering of the present invention. In another specific embodiment, the ambient light filter is created using an analog to digital converter.

The ambient light filter of the present invention functions with any of a number of optical sensor configurations, including through-hole, reflective, and shutter sensors.

For a fuller understanding of the nature and advantages of the invention, reference should be made to the ensuing description taken in conjunction with the accompanying drawings.

BRIEF DESCRIPTION OF THE DRAWINGS

FIGS. 3A–B illustrate differing optical sensor arrangements for use with embodiments of the present invention.

DESCRIPTION OF THE PREFERRED EMBODIMENT

Figure 1:
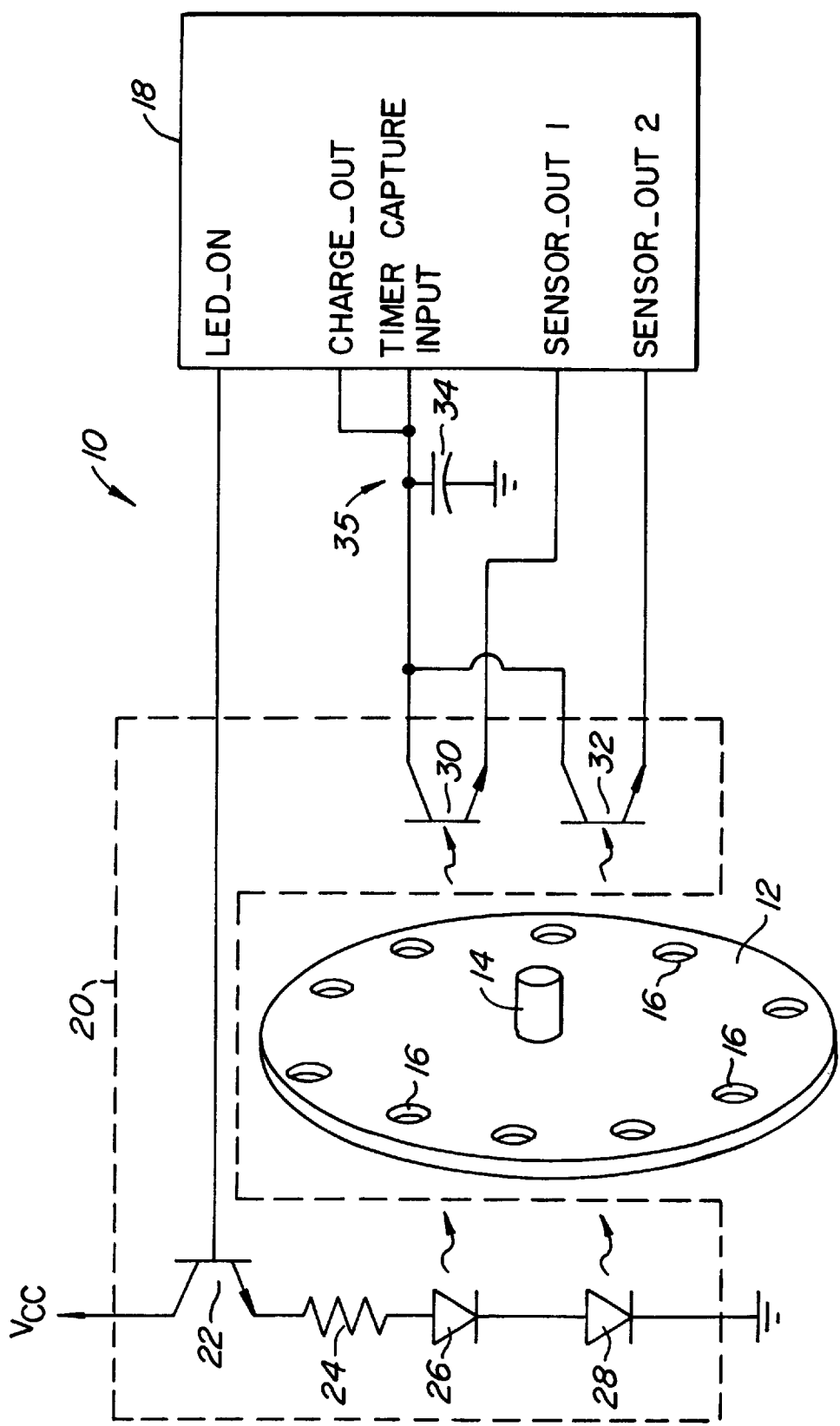
FIG. 1 is a schematic diagram of a first embodiment of a meter sensor ambient light filter according to the present invention.

FIG. 1 illustrates a first embodiment of a meter sensor ambient light filter according to the present invention. The system includes a meter disk 12, a microprocessor 18, and an optical sensing unit 20. FIG. 1 depicts an embodiment for use with a through-hole sensing arrangement. The disk 12 rotates about an electricity meter shaft 14 and includes a number of apertures 16 spaced about the periphery of the disk. Those skilled in the art will recognize that any number of apertures may be employed. Further, although a specific embodiment for use in a through-hole sensing arrangement is described, the system of the present invention may be readily adapted for use with any sensing arrangement which relies on the detection of changes in light.

The optical sensing unit 20 shown in FIG. 1 includes a pair of light emitting diodes 26, 28 and a pair of phototransistors 30, 32. Although a pair of each is shown, any number may be used with the filter system of the present invention. Further, a system may include more sensors than emitters and vice versa.

The apertures 16 of the disk 12 are positioned to allow passage of light between the diodes 26, 28 and the optical sensors 30, 32 when the disk rotates. The light emitting diodes 26, 28 are connected between a voltage supply Vcc and ground through a series connection of switching transistor 22 and resistor 24.

An output, LED_ON, of the microprocessor 18 is connected to supply driving signal pulses to switching transistor 22. Phototransistors 30, 32 are rendered conductive by light directed at their bases. In this specific embodiment the collectors of each phototransistor 30, 32 are connected to a Timer Capture Input of the microprocessor 18. As will be recognized by those skilled in the art, many microprocessors, particularly those which are control function oriented, i.e., the Motorola MC6805, have an internal timer which can be used to start a timing period through software control (i.e., the internal timer saves the current timer value). These microprocessors also have an input port which can be connected to external hardware to receive an "end of timing period" signal (which may be a voltage transition from a logic high to a logic low). In the present invention this port is referred to as the Timer Capture Input of the microprocessor 18.

Node 35 is coupled to ground through a capacitor 34 and is also coupled to an output of the microprocessor labeled CHARGE_OUT. The emitter of phototransistor 30 is coupled to a SENSOR_OUT 1 output of the microprocessor 18 while the emitter of phototransistor 32 is coupled to a SENSOR_OUT 2 output.

Operation of the meter sensor ambient light filter 10 of this specific embodiment of the present invention is controlled by operation of the microprocessor 18. A typical sensing and filtering operation includes the following sequence. First, an existing ambient light measurement is taken by a chosen one of the two optical sensors 30, 32 (the "active" sensor). To do this, the two sensor output lines from the microprocessor 18 are set to a high impedance level to prevent current flow through the optical sensors 30, 32. Capacitor 34 is then charged by asserting output line CHARGE_OUT high for a fixed period. At the end of the fixed charging period, CHARGE_OUT is placed in a high impedance condition and a capture timer of the microprocessor 18 is started.

Substantially simultaneously, one of the sensor outputs (of the "active" sensor) is asserted low. If the active photosensor is conductive, the capacitor 34 will be allowed to discharge. Assuming that the "active" photosensor is conductive (i.e., a certain amount of ambient light exists at the base of the active sensor), the capacitor will discharge and pull the Timer Capture Input of the microprocessor 18 to ground. This will take a certain amount of time which is recorded by the microprocessor 18. If a minimum amount of ambient light is not present at the base of the active sensor, the capacitor 34 will not be allowed to discharge. Instead, the counter will stop as soon as it reaches a preselected maximum count value. If the maximum count value is reached the microprocessor 18 will drive the Timer Capture Input low, and the microprocessor will record that the time required to discharge the capacitor 34 was equal to the maximum count. According to one embodiment of the present invention, the microprocessor 18 then stores a value proportional to the amount of ambient light existing in terms of the photocurrent generated. This value is equal to the preselected maximum count value minus the measured timer capture input time. A value of zero indicates that no measurable ambient light existed at the time of measurement, while a positive value will indicate the presence of some measurable ambient light. The microprocessor 18 stores this measured value.

At this point, the microprocessor 18 causes the light emitting diodes 26, 28 to conduct by asserting output LED_ON high. This turns switching transistor 22 on and connects diodes 26, 28 to Vcc through resistor 24. A measurement of the active sensor's photocurrent is again taken to determine if an aperture 16 is present under the active sensor. This measurement is taken in the manner discussed above for ambient light. That is, outputs SENSOR_OUT 1 and SENSOR_OUT 2 are placed in a high impedance state while capacitor 34 is charged. The emitter of the active sensor (30 or 32) is then placed low by driving an appropriate sensor output of microprocessor 18 low. A timer in the microprocessor 18 determines whether the capacitor 34 discharges more quickly than the stored maximum count value. The total amount of photocurrent is then calculated. The microprocessor 18 then calculates the amount of photocurrent attributable to sources other than the ambient light by subtracting the stored ambient photocurrent value from the stored ambient and LED value. The microprocessor concludes that one of the disk apertures 16 was under the active optical sensor if the calculated photocurrent is greater than a preset threshold value determined by the particular emitters used in the system.

This process may be continually repeated by the system to accurately detect rotation of disk 12. Fluctuations in ambient light attributable to natural or human sources are compensated for by continual monitoring of ambient light. Because the system is implemented using a microprocessor, values such as the maximum count time may be varied for different components and implementations. Those skilled in the art will recognize that the maximum count time and threshold values may be selected to correspond to the characteristics of the light emitting diodes and photosensors chosen for a particular implementation. This embodiment of the present invention may be modified to accommodate different aperture placements. Further, the number of light emitting diodes and corresponding optical sensors may be less than, equal to, or greater than two depending upon the implementation. The present invention provides a simple, efficient, and effective means for implementing a meter sensor ambient light filter. Many current implementations of meter sensors already include a microprocessor. Thus, the system of the present invention provides an easily-implemented filter system which requires the addition of a single low cost part (a capacitor) to the circuit.

Figure 2:
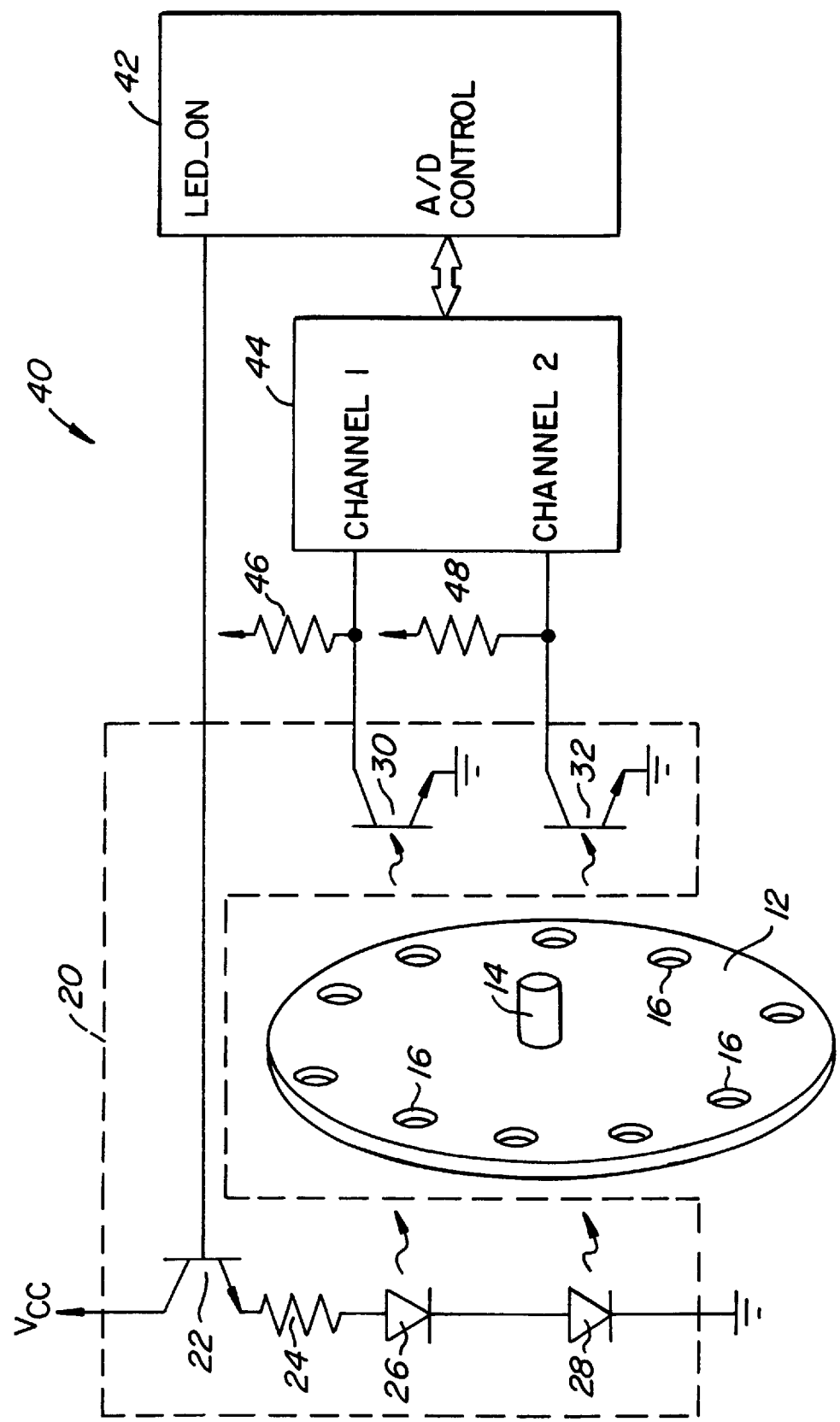
FIG. 2 is a schematic diagram of a second embodiment of a meter sensor ambient light filter according to the present invention.

A second embodiment of a meter sensor ambient light filter 40 is shown in FIG. 2. The specific implementation shown, like the implementation shown in FIG. 1, supports a through-hole detection scheme where rotation is measured using an optical sensing unit 20 to detect light passage through the apertures 16 of meter disk 12. In this implementation, however, an analog to digital converter (ADC) 44 is used to make an analog reading of the optical detector circuitry. Any commercially-available ADC may be used. In one specific embodiment ADC part number 1098 available from Linear Technology Corp. of Milpitas Calif. is used.

In this implementation, the ADC 44 is controlled by the microprocessor 42 to detect current flow on two channel inputs. Channel 1 is coupled to Vcc through a resistor 46 and to the collector of phototransistor 30. Channel 2 is also coupled to a resistor 48 and the collector of a phototransistor 32. Operation of the system progresses in a similar manner as for the system described in conjunction with FIG. 1. A measurement of current is first taken of an active sensor (either phototransistor 30 or 32) while the photodiodes 26, 28 are off (i.e., output LED_ON is asserted low). This value is stored as a value "proportional" to the ambient light striking the active phototransistor. Those skilled in the art will, of course, recognize that the term "proportional" as used herein means that (in the case of the phototransistors 30, 32) more light on the phototransistors 30, 32 causes more current to pass through the phototransistors 30, 32. Consequently, the voltages at the nodes connecting the phototransistors 30, 32 to the resistors 46, 48, respectively, will be lowered as the greater the current passing through the phototransistors, and their related resistors, causes the voltage measured across the resistors 46, 48 to increase thereby lowering the voltage at the collector of the phototransistor.

The photodiodes 26, 28 are then turned on by asserting LED_ON high. A measurement is then taken of the active phototransistor to get a second value proportional to the total light striking the phototransistor. This value will include a component equal to the existing ambient light and a component equal to the light emitted by the diode (Of course, this latter component will be dependent upon the positioning of the apertures 16). The previously stored ambient light value is subtracted from the second measured value to determine if a component attributable to a diode was present. Again, this process may be continually repeated to constantly sample the existing ambient light, store it, and take measurements with the sensor system.

The ambient light filter system according to the present invention may be implemented with any sensor arrangement. For example, referring now to FIG. 3, two different meter rotation sensing arrangements are shown which may be used with the ambient light filter of the present invention. In FIG. 3A a meter disk 50 is shown which includes at least one non-reflective patch 52. The optical sensing unit 20 includes at least one emitting device 54 (e.g., a light emitting diode) and at least one detector device 56 (e.g., a phototransistor). The system registers the non-conductance of the detector device 56 (e.g., when the sensor is positioned over the non-reflective patch 52). Such an arrangement may be augmented with the ambient light filter system of the present invention to prevent misrecognition of disk 50 movement due to ambient light.

FIG. 3B depicts another arrangement which may be augmented using the ambient light filter system of the present invention. In this implementation, at least one shutter or notch 62 is formed in a meter disk 60. As the disk 60 rotates, an optical sensing unit 20 registers the movement. Again the optical sensing unit 20 includes at least one emitter 64 and at least one detector 66.

Although a number of specific embodiments have been described, those skilled in the art will recognize that a number of variations of the present invention may be made. For example, the sensors may be located at any mechanically convenient location within a meter, such as on a gear, dial, disk, or the like. Although the use of light emitting diodes and phototransistors has been described, those skilled in the art will recognize that the present invention may be implemented with any light emitting and detecting device. Further, although a specific application has been described, the ambient light filter may be used in any application where it is helpful to remove ambient light fluctuations from optical measurements.

Accordingly, the disclosure of the invention is intended to be illustrative, but not limiting, of the scope of the invention which is set forth in the following claims. In that regard, while a specific, preferred embodiment of the invention has been described herein with reference to light emitting diodes and phototransistors, the invention is not intended to be limited thereby. For example, photovoltaic cells, photoresistive cells, or photodiodes could be used in place of the phototransistors described herein with respect to the preferred embodiment of the invention (with suitable, minor changes to the remaining circuitry). Accordingly, as used herein, the term "phototransistors" is intended to include all electronic elements in which the detection of varying degrees of light can be related to an electronic signal. Further the terms "collector" and "emitter" are intended to include any lead to any such photosensitive device.

I claim:

1. An ambient light filter comprising:

light emitting circuitry;

optical detection circuitry, positioned to detect light from said light emitting circuitry;

a capacitor coupled to said optical detection circuitry; and a microprocessor for separately controlling said light emitting circuitry and said optical detection circuitry to take an ambient light measurement when said light emitting circuitry is off, and to take at least a first subsequent measurement when said light emitting circuitry is on, and converting said measurements to values which are processed into a single value proportional to light measured in said first subsequent measurement exclusive of said ambient light measurement, wherein said microprocessor supplies said capacitor with a predetermined quantity of charge and measures discharge time of said capacitor to obtain said ambient light measurement and said first subsequent measurement, said capacitor being discharged through said optical detection circuitry at a rate proportional to intensity of light detected when taking said ambient light measurement and said first subsequent measurement.

2. The light filter of claim 1 wherein said light emitting circuitry comprises at least a first light emitting diode.

3. The light filter of claim 2 wherein said at least first light emitting diode is positioned to create a light path through an aperture in a meter disk when said meter disk is in a specific rotational position.

4. The light filter of claim 3 wherein said optical detection circuitry comprises at least a first phototransistor including:

(a) a first terminal coupled to a node, said node coupled to ground through said capacitor, said node further coupled to a timer input and a charging output of said microprocessor;

(b) a second terminal coupled to an output of said microprocessor; and (c) a third terminal positioned to detect light emitted from said at least first light emitting diode when said aperture of said meter is positioned in said light path.

5. The light filter of claim 2 wherein said at least first light emitting diode is positioned to reflect light off a surface of a meter disk and wherein said optical detection circuitry is positioned to detect the reflection of said light off said surface.

6. The light filter of claim 2 wherein said at least first light emitting diode is positioned to create a light path through at least a first shutter along an edge of a meter disk and wherein said optical detection circuitry is positioned in said light path when said meter disk is in a specific rotational position.

7. A method for filtering ambient light from a photosensor, the method comprising the steps of:

deactivating a known light emitting source;

exposing said photosensor to said ambient light;

operating said photosensor to establish a first light measurement while said known light emitting source is known to be off by discharging a predetermined quantity of charge through said photosensor over a first time interval;

activating said known light emitting source;

exposing said photosensor to said ambient light and to said known light emitting source;

operating said photosensor to establish a second light measurement while said known light emitting source is active by discharging said predetermined quantity of charge through said photosensor over a second time interval; and subtracting said first light measurement from said second light measurement to achieve a light measurement that excludes said ambient light.

8. The method of claim 7 further comprising the step of incrementing meter rotation information when said difference between said first and second measurements is attributable to said known light emitting source.

9. The method of claim 7 further comprising the step of incrementing a set of meter rotation information when said light measurement that excludes ambient light is equivalent to the light generated by said known light emitting source.

10. The method of claim 7; wherein said step of operating said photosensor to establish a first light measurement further includes the steps of:

placing a first output of a microprocessor in a high impedance condition, said first output coupled to a first terminal of said photosensor;

charging a node coupled to a second terminal of said photosensor by asserting a second output of said microprocessor for a fixed period of time;

placing said second output in a high impedance condition at the end of said fixed period of time;

asserting said first output low to render said photosensor conductive during said first time interval if a certain amount of light is present; and measuring said first time interval to establish said first light measurement.

11. The method of claim 10, wherein said step of operating said photosensor to establish a second light measurement further includes the steps of:

placing said first output of said microprocessor in a high impedance condition, said first output coupled to said first terminal of said photosensor;

charging said node coupled to said second terminal of said photosensor by asserting said second output of said microprocessor for a fixed period of time;

placing said second output in a high impedance condition at the end of said fixed period of time;

asserting said first output low to render said photosensor conductive during said second time interval if a certain amount of light is present; and measuring said second time interval to establish said second light measurement.

12. The method of claim 7, wherein said first time interval is proportional to an intensity of said ambient light, and wherein said second time interval is proportional to a combined intensity of said ambient light and said known light emitting source.

13. An ambient light filter comprising:

light emitting circuitry;

optical detection circuitry comprising:
   a resistor;
   a phototransistor having a photosensitive first terminal, a second terminal coupled to said resistor, and a third terminal coupled to ground; and
   an analog to digital converter having an input and an output, said input being coupled to said second terminal of said phototransistor; and a microprocessor coupled to said light emitting circuitry and to said output of said analog to digital converter for removing ambient light from total detected light by taking an ambient light measurement when said light emitting circuitry is off and by taking at least a first subsequent measurement when said light emitting circuitry is on, wherein said analog to digital converter samples voltage levels present at said second terminal during said ambient light measurement and said first subsequent measurement and converts said detected voltage levels to digital representations, said digital representations being proportional to the intensity of light received during said ambient light measurement and said first subsequent measurement.

14. An ambient light filter comprising:

light emitting circuitry;

optical detection circuitry comprising:
   detection means for detecting incident light,
   charge storage means for storing a predetermined quantity of charge, and
   discharging means for discharging said predetermined quantity of charge; and a microprocessor coupled to said light emitting circuitry and to said optical detection circuitry, said microprocessor comprising:
   charging means for supplying said predetermined quantity of charge to said optical detection circuitry; and
   timing means for measuring discharge time of said predetermined quantity of charge from said optical detection circuitry, wherein said discharge time is related to intensity of said incident light.

15. The ambient light filter of claim 14, wherein said charge storage means comprises a capacitor.

16. The ambient light filter of claim 15, wherein said detection means comprises a first terminal of a phototransistor and said discharging means comprises a path between a second terminal and a third terminal of said phototransistor.

17. The ambient light filter of claim 16, wherein said microprocessor further comprises a variable impedance port coupled to said third terminal of said phototransistor, said variable impedance port being switchable between a high impedance state and a low impedance state.

18. A method for removing ambient light from total light received at a photosensor, thereby determining a light level received from a known emitter, the method comprising the steps of:

measuring said ambient light illuminating said photosensor, comprising the steps of:
   deactivating said known emitter;
   charging a capacitor to a predetermined voltage;
   permitting said photosensor to become conductive when illuminated by said ambient light;
   discharging said capacitor through said photosensor;
   measuring a first discharge time; and
   calculating an ambient light intensity from said first discharge time;

measuring said total light illuminating said photosensor comprising the steps of:
   activating said known emitter;
   charging said capacitor to a predetermined voltage;
   permitting said photosensor to become conductive when illuminated by said total light;
   discharging said capacitor through said photosensor;
   measuring a second discharge time; and
   calculating a total light intensity from said second discharge time; and determining said light level received from said known emitter by subtracting said ambient light intensity from said total light intensity.

* * * * *